(12) United States Patent
Lee et al.

(10) Patent No.: US 7,759,677 B2
(45) Date of Patent: Jul. 20, 2010

(54) MOLECULAR ELECTRONIC DEVICE INCLUDING ORGANIC DIELECTRIC THIN FILM AND METHOD OF FABRICATING THE SAME

(75) Inventors: Hyoyoung Lee, Daejeon (KR); Gyeong Sook Bang, Daejeon (KR); Jonghyurk Park, Daegu (KR); Junghyun Lee, Daejeon (KR); Nak Jin Choi, Daegu (KR); Ja Ryong Koo, Seoul (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 411 days.

(21) Appl. No.: 11/760,872

(22) Filed: Jun. 11, 2007

(65) Prior Publication Data

US 2008/0054256 A1     Mar. 6, 2008

(30) Foreign Application Priority Data

Sep. 5, 2006    (KR) .............. 10-2006-0085375
Oct. 23, 2006   (KR) .............. 10-2006-0103137

(51) Int. Cl.
*H01L 35/24*     (2006.01)
*H01L 51/00*     (2006.01)

(52) U.S. Cl. ........... 257/40; 257/E21.264; 257/E51.001
(58) Field of Classification Search ............ 257/40
See application file for complete search history.

(56) References Cited

U.S. PATENT DOCUMENTS 6,809,196 B2   10/2004   Bamdad et al.
6,972,196 B1   12/2005   Mrksich et al.

(Continued)

FOREIGN PATENT DOCUMENTS

JP     2-232979     9/1990

(Continued)

OTHER PUBLICATIONS

Bandyopadhyay et al, "Large conductance switching and memory effects in organic molecules for data-storage applications," Applied Physics Letters, vol. 82, No. 8, Feb. 24, 2003, pp. 1215-1217.*

(Continued)

*Primary Examiner*—Kenneth A Parker
*Assistant Examiner*—Anthony Ho
(74) *Attorney, Agent, or Firm*—Ladas & Parry LLP

(57) ABSTRACT

Provided are a molecular electronic device and a method of fabricating the molecular electronic device. The molecular electronic device includes a substrate, an organic dielectric thin film formed over the substrate, a molecular active layer formed on the organic dielectric thin film and having a charge trap site, and an electrode formed on the molecular active layer. The organic dielectric thin film may be immobilized on the electrode or a Si layer by a self-assembled method. The organic dielectric thin film may include first and second molecular layers bound together through hydrogen bonds. An organic compound may be self-assembled over the substrate to form the organic dielectric thin film. The organic compound may include an M'-R-T structure, where M', R and T represent a thiol or silane derivative, a saturated or unsaturated $C_1$ to $C_{20}$ hydrocarbon group which is substituted or unsubstituted with fluorine (F), and an amino(—$NH_2$) or carboxyl (—COOH) group, respectively.

13 Claims, 10 Drawing Sheets

U.S. PATENT DOCUMENTS

| | | | |
|---|---|---|---|
| 2004/0023366 A1* | 2/2004 | Dickopf et al. | 435/287.2 |
| 2005/0072989 A1 | 4/2005 | Bawendi et al. | |
| 2005/0077575 A1* | 4/2005 | Shin et al. | 257/347 |
| 2006/0097248 A1* | 5/2006 | Lee et al. | 257/40 |
| 2007/0152210 A1* | 7/2007 | Han et al. | 257/40 |

FOREIGN PATENT DOCUMENTS

| | | |
|---|---|---|
| JP | 9-246626 | 9/1997 |
| JP | 2005-228804 | 8/2005 |
| KR | 1020030021674 | 3/2003 |
| WO | WO2004/086458 | 10/2004 |

OTHER PUBLICATIONS

Bandyopadhyay et al, "Large conductance switching and binary operation in organic devices: Role of functional groups," J. Phys. Chem. B, 2003, 107, pp. 2531-2536.*

Hyoyoung Lee. "Molecular Logic Array and Memory Device",Sep. 1, 2006. Electronics and Telecommunications Research Institute, Daejeon, Korea.

Hua Wang et al. "Improved Method for the Preparation of Carboxylic Acid and Amine Terminated Self-Assembled Monolayers of Alkanethiolates", Mar. 29, 2005. The ACS Journal of Surfaces and Colloids, vol. 21, No. 7.

* cited by examiner

MOLECULAR ELECTRONIC DEVICE INCLUDING ORGANIC DIELECTRIC THIN FILM AND METHOD OF FABRICATING THE SAME

CROSS-REFERENCE TO RELATED PATENT APPLICATION

This application claims the benefits of Korean Patent Application No. 10-2006-0085375, filed on Sep. 5, 2006, and Korean Patent Application No. 10-2006-0103137, filed on Oct. 23, 2006, in the Korean Intellectual Property Office, the disclosures of which are incorporated herein in their entirety by reference.

BACKGROUND OF THE INVENTION

1. Field of the Invention

The present invention relates to a molecular electronic device, and more particularly, to a molecular electronic device including a molecular active layer with a charge trap site and a method of fabricating the device.

2. Description of the Related Art

Much research has been dedicated to developing an organic semiconductor device using an organic material having π-electron conjugated bonds. Most of the attempts have been focused on electron transport characteristics of an organic layer interposed between two metal electrodes. Researchers have also attempted to apply charging of molecules caused by the polarization of π-electrons of molecules to a molecular switching device or a memory. In particular, as devices necessary for commercializing nanoscale semiconductor products have competitively developed, more highly integrated and miniaturized molecular electronic devices need to be developed.

A basis structure of a conventional molecular electronic device includes two metal electrodes and an organic molecular active layer interposed between the two metal electrodes. The organic molecular active layer provides organic semiconductor characteristics in between the two metal electrodes. One recent technical development is a method of forming a molecular active layer composed of a single molecular layer obtained by which the organic molecular active layer is self-assembled over one of the metal electrodes. Using this method, a molecular active layer composed of a single molecular layer may be formed, wherein the molecular active layer is several nanometers thick and less dense than the conventional one. Thus, when a metal layer for forming an electrode is deposited, an electrode material (i.e., metal) often penetrates into the molecular active layer. As a result, short circuits may occur in the molecular electronic device, and thus, the commercialization of such a molecular electronic device may be difficult.

SUMMARY OF THE INVENTION

The present invention provides a molecular electronic device with a desired electronic characteristic by preventing short circuits, usually caused by penetration of an electrode material into a molecular active layer, when implementing an ultra-highly integrated nanoelectronic device including a miniaturized structure of several to several tens of nanometers that utilizes an electronic characteristic of the molecular active layer.

The present invention also provides a method of fabricating a molecular electronic device capable of improving yield and reliability of ultra-highly integrated nanoelectronic devices including a miniaturized structure of several to several tens of nanometers by preventing short circuits, usually caused by penetration of an electrode material into a molecular active layer when forming an electrode over the molecular active layer.

According to an aspect of the present invention, there is provided a molecular electronic device. The molecular electronic device includes a substrate, an organic dielectric thin film formed over the substrate, a molecular active layer formed on the organic dielectric thin film and having a charge trap site, and an electrode formed on the molecular active layer.

The organic dielectric thin film may comprise a molecular structure represented by Formula 1 as follows:

M-R-T      Formula 1 where M is a sulfur (S)-containing group or a silicon (Si)-containing group; R is a saturated or unsaturated $C_1$ to $C_{20}$ hydrocarbon group which is substituted or unsubstituted with fluorine (F); and T is a thiol (—SH) group, an amino (—$NH_2$) group, or a carboxyl (—COOH) group.

As one preferable embodiment of the present invention, the M may be —S—. In the molecular electronic device according to one embodiment of the present invention, the substrate may comprise a metal electrode. In such a case, the organic dielectric thin film may be immobilized on the metal electrode by a self-assembled method.

As another preferable embodiment of the present invention, the M may comprise ≡Si—. In the molecular electronic device according to one embodiment of the present invention, the substrate may comprise a Si layer. In such a case, the organic dielectric thin film may be immobilized on the Si layer by a self-assembled method.

In the molecular electronic device according to one embodiment of the present invention, the organic dielectric thin film may be formed in a double molecular layer structure comprising first and second molecular layers each structured in the molecular structure. The first and second molecular layers may bind together through hydrogen bonds between —$NH_2$ groups or between —COOH groups.

The molecular active layer may comprise a molecular layer from an organic compound bound to the organic dielectric thin film. The organic compound may comprise π electrons and one functional group selected from a group consisting of a —COOH group, a —COONa group, and succin imidyl ester group.

The molecular electronic device according to one embodiment of the present invention may be configured as a switching device capable of switching between an on or off state according to a voltage applied between the metal electrode and the electrode spaced apart a certain distance from each other by having the organic dielectric thin film and the molecular layer therebetween.

Alternatively, the molecular electronic device may be configured as a memory storing a certain electrical signal according to a voltage applied between the metal electrode and the electrode spaced apart a certain distance from each other by having the organic dielectric thin film and the molecular layer therebetween.

Alternatively, the molecular electronic device may comprise a Si layer and an electrode spaced apart a certain distance from each other by having the organic dielectric thin film and the molecular layer therebetween. In such a case, the molecular electronic device may be configured as a charge trapping memory storing a predetermined electrical signal by charges transported from a channel formed in the Si layer according to a voltage applied to the electrode.

According to another aspect of the present invention, there is provided a method of fabricating a molecular electronic device. An organic dielectric thin film is formed over a substrate. A molecular active layer is formed on the organic dielectric thin film, wherein the molecular active layer comprises an organic material with a charge trap site. An electrode is formed on the molecular active layer.

The forming of the organic dielectric thin film may comprise self-assembling an organic compound on the surface of the substrate.

The forming of the organic dielectric thin film may comprise dipping the substrate into a solvent in which an organic compound is dissolved. The organic compound may comprise a structure represented by Formula 2 as follows:

Formula 2 where M' is a thiol derivative or a silane derivative; R is a saturated or unsaturated $C_1$ to $C_{20}$ hydrocarbon group which is substituted or unsubstituted with fluorine (F); and T is an amino (—$NH_2$) group or a carboxyl (—COOH) group.

The method may further comprise, prior to forming the organic dielectric thin film, forming a metal electrode on the substrate. In such a case, the forming of the organic dielectric thin film may include dipping the substrate on which the metal electrode is formed into a solvent in which an organic compound is dissolved. The organic compound may comprise a structure represented by Formula 3 as follows:

Formula 3 where M' is a thiol derivative; R is a saturated or unsaturated $C_1$ to $C_{20}$ hydrocarbon group which is substituted or unsubstituted with fluorine (F); and T is an amino (—$NH_2$) group or a carboxyl (—COOH) group.

The forming of the organic dielectric thin film may be performed in an anhydrous and anoxic ambient.

The forming of the organic dielectric thin film may comprise forming a first molecular layer by self-assembling a first organic compound on the metal electrode, wherein the first organic compound may be represented by Formula 3 of M'-R-T, and forming a second molecular layer by binding a second organic compound to the first organic compound, wherein the second organic compound may be represented by Formula 3 of M'-R-T. The first molecular layer and the second molecular layer may bind together through hydrogen bonds between —$NH_2$ groups or between —COOH groups. Also, the forming of the first molecular layer may be performed in situ with the forming of the second molecular layer.

After forming the organic dielectric thin film, a thiol derivative group may be exposed on the upper surface of the organic dielectric thin film. In such a case, the forming of the molecular active layer may comprise chemically binding an organic compound with the thiol derivative group existing on the upper surface of the organic dielectric thin film, wherein the organic compound may comprise π electrons and one function group selected from a group consisting of a —COOH group, a —COONa group, and succin imidyl ester group.

According to various exemplary embodiments of the present invention, when an electrode material is deposited over the molecular layer, even if the electrode material penetrates into the molecular active layer, the penetrated the electrode material cannot reach a bottom conductive layer since a distance from the molecular active layer to the bottom conductive layer increases due to the organic dielectric thin film formed between the molecular active layer and the bottom conductive layer. Therefore, the molecular electrode device according to the embodiments of the present invention can prevent an occurrence of short-circuit usually caused by the penetration of the electrode material into the molecular active layer. Accordingly, it is possible to improve yield and reliability of ultra-highly integrated nanoelectronic devices including a miniaturized structure with the size of several nanometers to several tens of nanometers.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
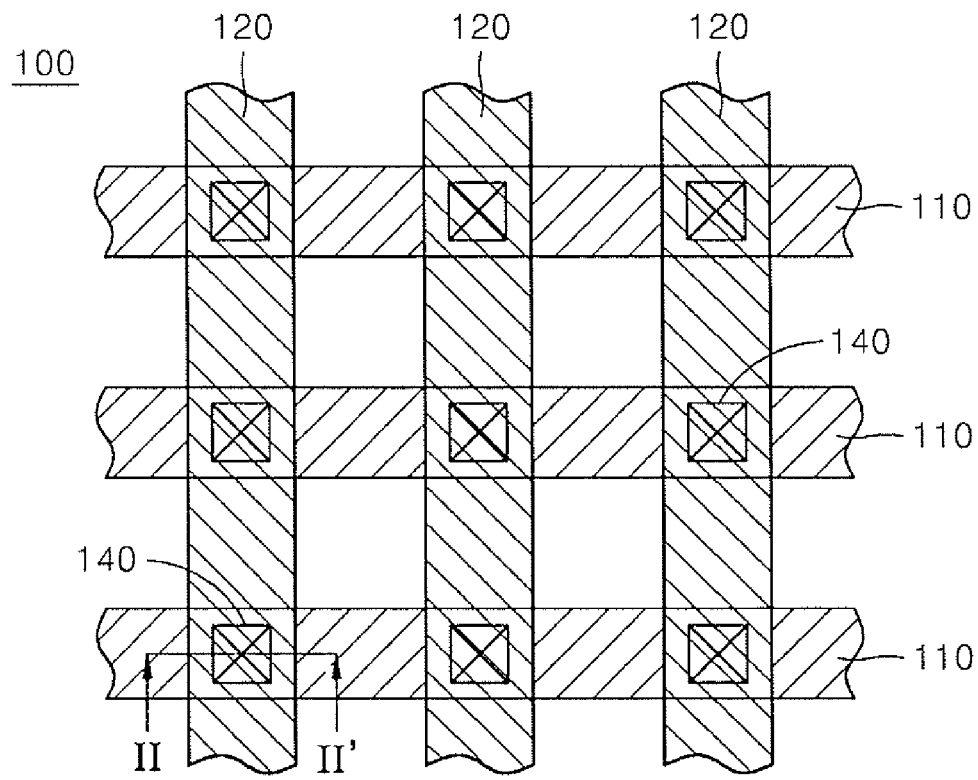
FIG. 1 illustrates a layout of a molecular electronic device structure according to a first embodiment of the present invention.

The present invention will now be described more fully with reference to the accompanying drawings, in which exemplary embodiments of the invention are shown.

The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses and widths of layers or regions are exaggerated for clarity. Like reference numerals in the drawings denote like elements.

Figure 2:
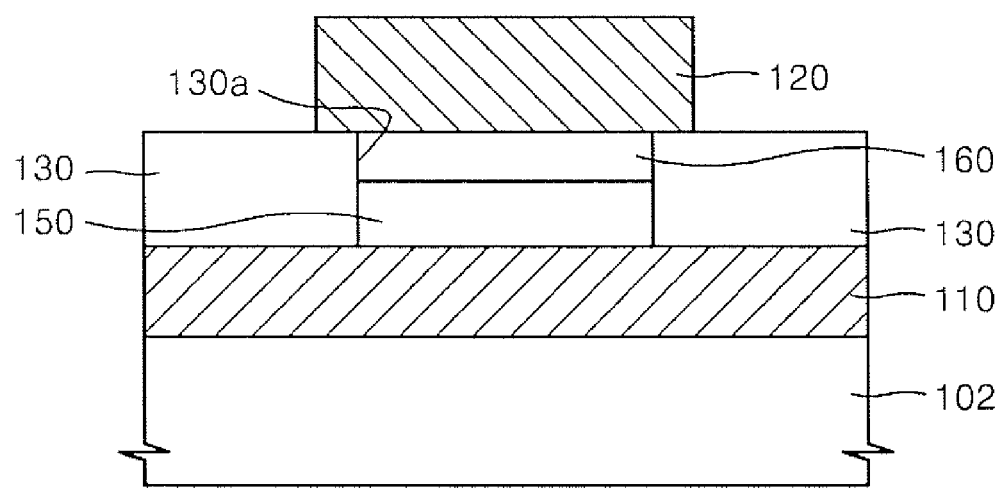
FIG. 2 illustrates a cross-sectional view of the molecular electronic device taken along a line II-II' illustrated in FIG. 1, according to an embodiment of the present invention.

FIG. 1 illustrates a layout of a molecular electronic device 100 according to a first embodiment of the present invention. Referring to FIG. 1, the molecular electronic device 100 includes a 3×3 array of bottom electrodes 110 and top electrodes 120. FIG. 2 illustrates a cross-sectional view of the molecular electronic device 100 taken along a line II-II' illustrated in FIG. 1.

Referring to FIGS. 1 and 2, the bottom electrodes 110 and the top electrodes 120 of the molecular electronic device 100 extend perpendicular to each other to intersect with each other over certain regions of a substrate 102. Contacts 140 are formed at these intersection regions to electrically connect the bottom electrodes 110 with the respective top electrodes 120.

The substrate 102 may be formed of silicon (Si). The bottom electrodes 110 and the top electrodes 120 each may be formed of a conductive material such as a metal such as gold (Au), platinum (Pt), silver (Ag), or chrome (Cr), doped polysilicon, or a combination thereof. Although not illustrated, each of the bottom and top electrodes 110 and 120 may further include a barrier layer depending on needs. The barrier layer may include a titanium (Ti) layer.

An insulation pattern 130 is formed between the bottom electrodes 110 and the top electrodes 120.

Nano-via holes 130A are formed in the insulation pattern 130 to provide the corresponding contacts 140 at which the corresponding bottom and top electrodes 110 and 120 intersect with each other. The insulation pattern 130 may be formed of silicon nitride, silicon oxide, or a combination thereof. The nano-via holes 130A may have a width in a range of about 100 nm to 160 nm. However, the width of the nano-via holes 130A is not limited to this range.

An organic dielectric thin film 150 is formed over the surface of the portion of the bottom electrodes 110 exposed through the nano-via holes 130A. The organic dielectric thin film 150 may be formed on the surface of the bottom electrodes 110 using a self-assembly method. A molecular active layer 160 is formed on the organic dielectric thin film 150.

For instance, the organic dielectric thin film 150 may include a molecular structure represented by Formula 1 below.

M-R-T     [Formula 1]

Herein, M is a sulfur (S)-containing group obtained from thiol derivatives or a silicon (Si)-containing group obtained from silane derivatives. R is a saturated or unsaturated $C_1$ to $C_{20}$ hydrocarbon group which is substituted or unsubstituted with fluorine (F). T is a thiol (—SH) group, an amino (—NH$_2$) group, or a carboxyl (—COOH) group.

For instance, if the bottom electrodes 110 are formed of Au, the M in Formula 1 may be a —S— binding group that can be obtained from thiol derivatives in order for the organic dielectric thin film 150 be self-assembled on the bottom electrodes 110. In such a case, the organic dielectric thin film 150 can selectively bind to the surface of the bottom electrodes 110 through —S— bonding by a self-assembly method using a thiol derivative included in a source material for the organic dielectric thin film 150 as an anchoring group.

The organic dielectric thin film 150 may be formed on the bottom electrodes 110 in a single molecular layer structure including a single molecular layer having a structure represented by Formula 1 or in a multiple molecular layer structure including sequentially stacked multiple molecular layers each having a structure represented by Formula 1.

For example, the organic dielectric thin film 150 formed on the bottom electrodes 110 may include two molecular layers each having a structure represented by Formula 1. That is, the organic dielectric thin film 150 may have a double molecular layer structure in which a first molecular layer and a second molecular layer are sequentially stacked. The first and second molecular layers may each have a structure represented by Formula 1, and bind together through hydrogen bonds between —NH$_2$ groups or between —COOH groups, both being included in each of the first and second molecular layers. The second molecular layer may be formed in situ with the formation of the first molecular layer.

The organic dielectric thin film 150 needs to be formed to a certain thickness that provides a spacing distance between the bottom electrodes 110 and the top electrodes 120, sufficient not to cause a short circuit, which usually occurs when an electrode material of the top electrodes 120 penetrates into the molecular active layer 160 during deposition of the top electrodes 120. The thickness of the organic dielectric thin film 150 may be determined by considering the sizes and thicknesses of the molecular active layer 160, the insulation pattern 130 and peripheral elements thereof. For instance, the organic dielectric thin film 150 may be formed to a thickness of about 2 nm to 10 nm to fabricate a miniaturized molecular electronic device with the size of several nanometers to several tens of nanometers corresponding to a current technological demand. As one method of adjusting the thickness of the organic dielectric thin film 150, appropriate selection of a hydrocarbon group labeled as R in Formula 1 allows adjusting the length of a carbon chain of a hydrocarbon group. As another method of adjusting the thickness of the organic dielectric thin film 150, the organic dielectric thin film 150 may be formed in a single molecular layer structure or in a multiple molecular layer structure including at least two molecular layers. In the case of forming the organic dielectric thin film 150 in a multiple molecular layer structure including more than three molecular layers, the lowermost molecular layer contacting the bottom electrodes 110 and the uppermost molecular layer contacting the top electrodes 120 are formed to include molecules with the structure represented by Formula 1. The intermediate molecular layers interposed between the lowermost molecular layer and the uppermost molecular layer may each have a structure represented by Formula 2 below.

T-R-T [Formula 2]

Herein, R is substantially the same as the R described in Formula 1. T is a —$NH_2$ group or a —COOH group.

The intermediate molecular layers each having a structure represented by Formula 2 may bind together through hydrogen bonds between —$NH_2$ groups or between —COOH groups, both included in each of the molecular layers.

The molecular active layer 160 formed between the organic dielectric thin film 150 and the top electrodes 120 may be formed of an organic material with a charge trap site. In particular, the molecular active layer 160 may include π-electrons and an organic compound including a —COOH group, a sodium carboxylate (—COONa) group or a succin imidyl ester group. The molecular active layer 160 chemically binds to the organic dielectric thin film 150 to have a certain molecular layer structure.

For instance, the molecular active layer 160 may be formed to have a structure in which a molecule having a structure represented by one of Formulae 3 through 7 below chemically binds to the organic dielectric thin film 150.

[Formula 3]

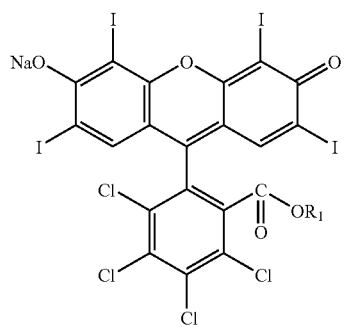

[Formula 4]

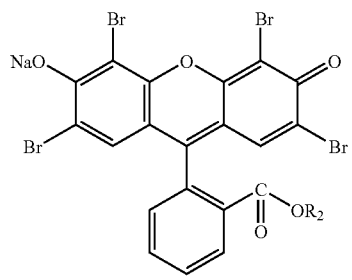

[Formula 5]

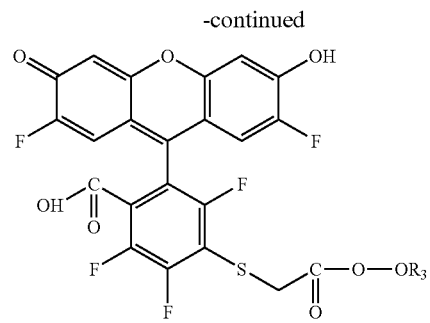

[Formula 6]

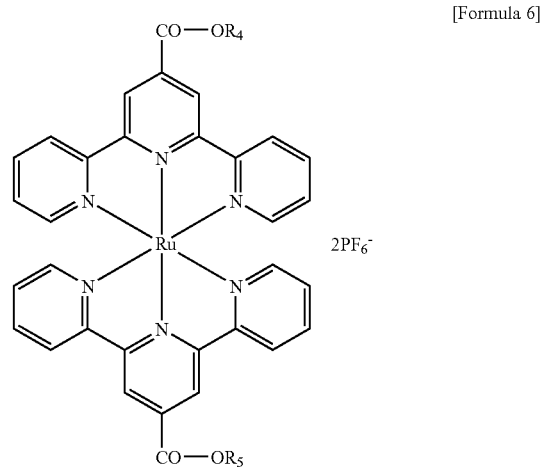

[Formula 7]

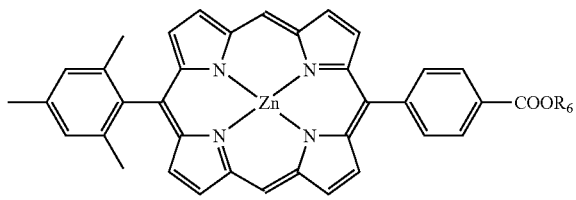

Herein, $R_1$, $R_2$, $R_3$, $R_4$, $R_5$, and $R_6$ each are —H, succin imidyl or Na group.

In the molecular electronic device 100 according to the first embodiment of the present invention and illustrated in FIGS. 1 and 2, the bottom electrodes 110, the organic dielectric thin film 150, the molecular active layer 160, and the top electrodes 120 may be configured as a switching device that can switch between an on or off state according to a voltage supplied between the bottom electrodes 110 and the top electrodes 120. Alternatively, the bottom electrodes 110, the organic dielectric thin film 150, the molecular active layer 160, and the top electrodes 120 may be configured as a memory that stores a certain electrical signal according to a voltage applied between the bottom electrodes 110 and the top electrodes 120.

Figure 3:
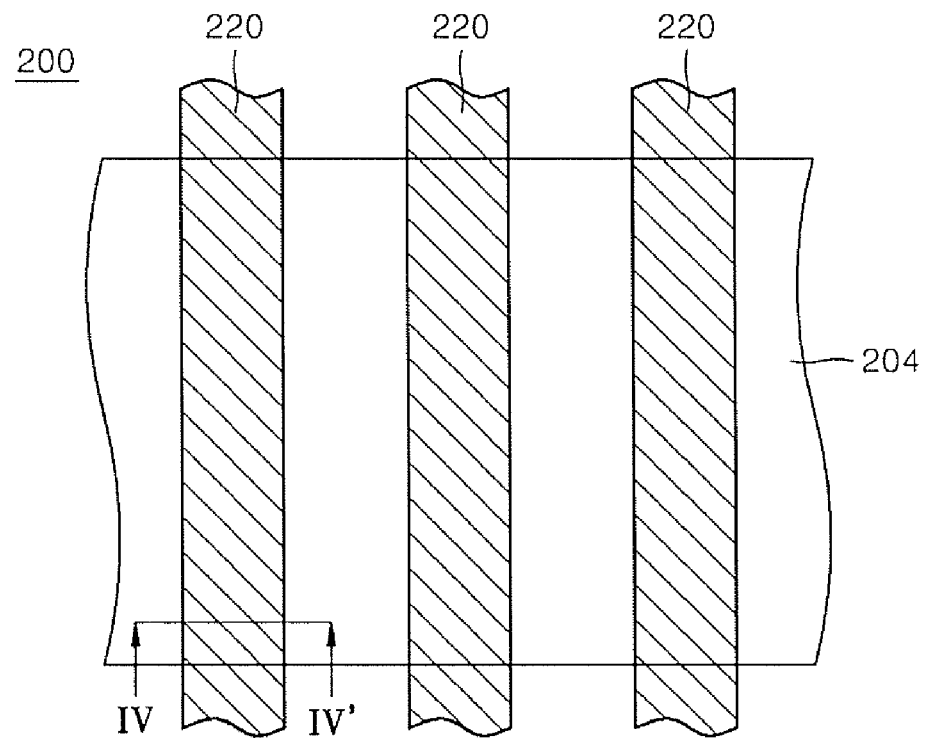
FIG. 3 illustrates a layout of a molecular electronic device structure according to a second embodiment of the present invention.

FIG. 3 illustrates a layout of a molecular electronic device 200 according to a second embodiment of the present invention.

Figure 4:
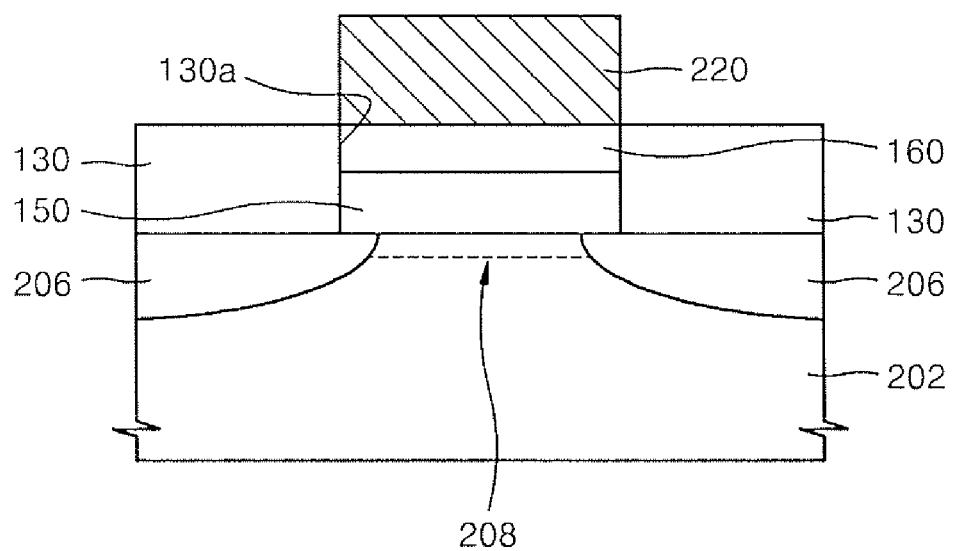
FIG. 4 illustrates a cross-sectional view of the molecular electronic device taken along a line IV-IV' illustrated in FIG. 3, according to an embodiment of the present invention.

FIG. 4 illustrates a cross-sectional view of the molecular electronic device 200 taken along a line IV-IV'.

In FIGS. 3 and 4, like reference numerals denoted in FIGS. 1 and 2 denote like elements, and thus, detailed descriptions thereof are not included.

Referring to FIGS. 3 and 4, in the molecular electronic device 200, a plurality of electrodes 220 extend parallel to each other over an active region 204 of a substrate 202. The substrate 202 may be formed of bulk silicon (Si). Also, the substrate 202 may include a Si layer of a silicon-on-insulator (SOI) substrate.

The electrodes 220 may be formed of a metal such as Au, Pt, Ag, or Cr, doped polysilicon or a combination thereof. Although not illustrated, depending on needs, a barrier layer may further be formed between the molecular active layer 160 and each of the electrodes 220. The barrier layer may include a Ti layer.

An organic dielectric thin film 150 is formed on a portion of the substrate 202 exposed through a nano-via hole 130A, which is formed in an insulation pattern 130. The organic dielectric thin film 150 may have a structure whereby it can be formed on the substrate 202 using a self-assembly method. The molecular active layer 160 is formed between the organic dielectric thin film 150 and each of the electrodes 220.

The organic dielectric thin film 150 has a configuration substantially the same as that described in FIGS. 1 and 2. In particular, if the substrate 202 is a Si-based substrate, the M in Formula 1 may be a ≡Si— binding group obtained from silane derivatives. In such a case, the organic dielectric thin film 150 can selectively bind to the surface of the substrate 202 through —Si— bonding by a self-assembly method using a silane derivative contained in a source material for the organic dielectric thin film 150 as an anchoring group.

The organic dielectric thin film 150 may be formed on the substrate 202 in a single molecular layer structure including a single molecular layer having a structure represented by Formula 1 or in a multiple molecular layer structure including sequentially stacked multiple molecular layers each having a structure represented by Formula 1.

For example, the organic dielectric thin film 150 may be formed over the substrate 202 in a double molecular layer structure including two molecular layers each represented by Formula 1. First and second molecular layers of the double molecular layer structure may each have a structure represented by Formula 1, and bind together through hydrogen bonds between —NH$_2$ groups or between —COOH groups, both being included in each of the first and second molecular layers. The second molecular layer may be formed in situ with the formation of the first molecular layer.

The molecular active layer 160 formed on the organic dielectric thin film 150 may be formed of an organic material with a charge trap site. The organic dielectric thin film 150 and the molecular active layer 160 are similar to those of FIGS. 1 and 2, and thus, detailed descriptions thereof are not included.

In the molecular electronic device 200 according to the second embodiment of the present invention and illustrated in FIGS. 3 and 4, the substrate 202, the organic dielectric thin film 150, the molecular active layer 160, and the electrode 220 may be configured as a charge trapping memory that stores a certain electrical signal due to charges transported from a channel 208 according to a voltage applied selectively to dopant diffusion regions 206, and a voltage applied to the electrodes 220. The channel 208 is formed in the substrate 202 between the dopant diffusion regions 206 and below the organic dielectric thin film 150. The dopant diffusion regions 206 are formed in the active region 204 of the substrate 202.

FIGS. 5A through 5D are cross-sectional views illustrating a method of fabricating a molecular electronic device according to an embodiment of the present invention.

In particular, FIGS. 5A through 5D exemplify a method of fabricating the molecular electronic device 100 according to the first embodiment of the present invention described with reference to FIGS. 1 and 2. The cross-sectional views illustrated in FIGS. 5A through 5D correspond to the cross-sectional view illustrated in FIG. 2. In FIGS. 5A through 5D, like reference numerals denoted in FIGS. 1 and 2 represent like elements and thus, detailed descriptions thereof are not included.

Figure 5A:
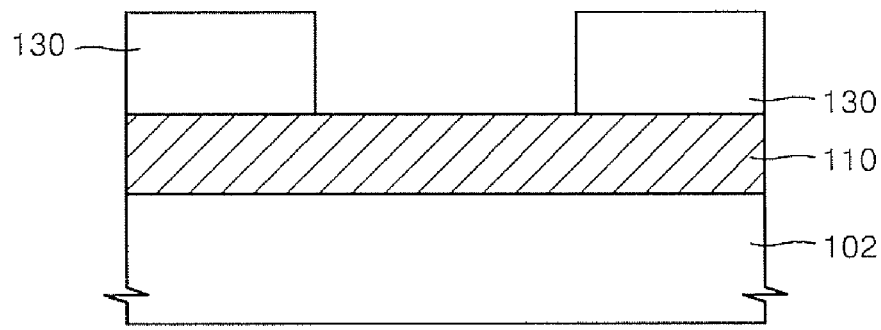
FIGS. 5A through 5D are cross-sectional views illustrating a method of fabricating a molecular electronic device according to an embodiment of the present invention.

Referring to FIG. 5A, a bottom electrode 110 is formed on a substrate 102. The bottom electrode 110 may have a stacked structure including a barrier layer and a conductive layer. The barrier layer and the conductive layer are similar to those described with reference to FIGS. 1 and 2, and thus, detailed descriptions thereof are not included. An insulation pattern 130 is formed on the bottom electrode 110, such that the insulation pattern 130 exposes an upper portion of the bottom electrode 110.

Figure 5B:
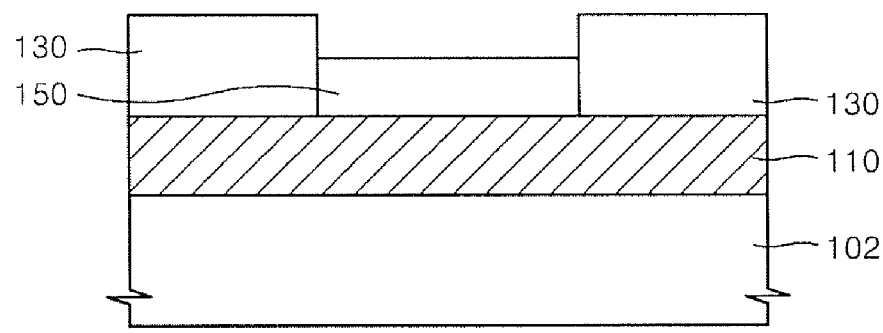

Referring to FIG. 5B, an organic dielectric thin film 150 is formed on the exposed upper portion of the bottom electrode 110.

The organic dielectric thin film 150 may be formed by dipping the structure illustrated in FIG. 5A into an organic solvent in which an organic compound is dissolved. The organic compound has a structure represented by Formula 8 below.

$$M'\text{-}R\text{-}T \qquad \text{[Chemical Formula 8]}$$

Herein, M' is a thiol derivative or a silane derivative. R and T are substantially the same as the R and T of Formula 1.

The organic dielectric thin film 150 may be formed at a temperature ranging from about 15° C. to 30° C.

Although not illustrated, if the organic dielectric thin film 150 is formed directly on the substrate 102 including Si, it is preferable to use an organic compound including a thiol derivative as the M' in Formula 8, so that the organic dielectric thin film 150 can be formed using a self-assembly method.

The organic dielectric thin film 150 may be formed in an anhydrous and anoxic ambient atmosphere.

Figure 6:
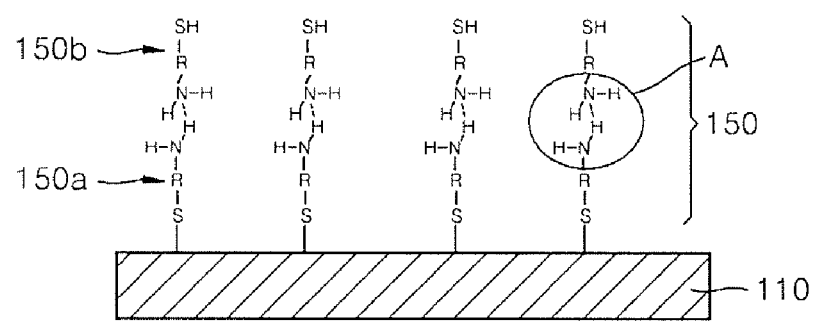
FIG. 6 illustrates an organic dielectric thin film having a double molecular layer structure, which may be included in a molecular electronic device according to an embodiment of the present invention.

FIG. 6 illustrates an organic dielectric thin film 150 with a double molecular layer structure obtained by forming an organic compound on the bottom electrode 110 using a self-assembly method. Among organic compounds having the structure represented by Formula 8, one exemplary organic compound may have a structure of HS—R—NH$_2$, where R is substantially the same as the R of Formula 1.

In FIG. 6, a first molecular layer 150a and a second molecular layer 150b included in the organic dielectric thin film 150 bind together by hydrogen bonds between —NH$_2$ groups as indicated by reference denotation "A."

Figure 5C:
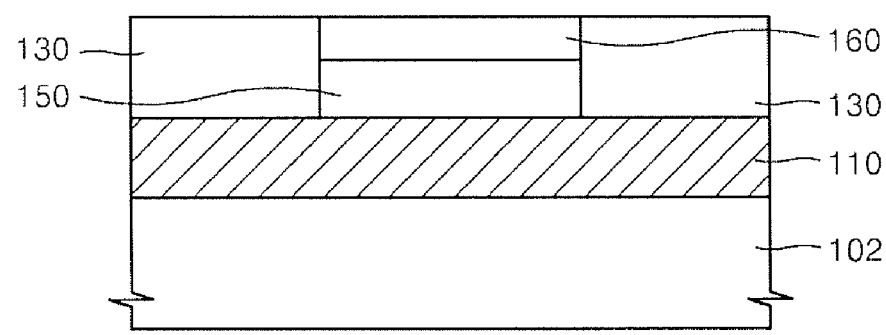

Referring to FIG. 5C, a molecular active layer 160 is formed on the organic dielectric thin film 150. The molecular active layer 160 includes an organic material with a charge trap site.

An organic compound that includes π electrons and a functional group selected from a group consisting of a —COOH group, a —COONa group and a succin imidyl ester group may chemically bind to the organic dielectric thin film 150 to form the molecular active layer 160. For instance, if a thiol derivative group is exposed on the upper surface of the organic dielectric thin film 150, the molecular active layer 160 chemically binds to the thiol derivative group.

Figure 7:
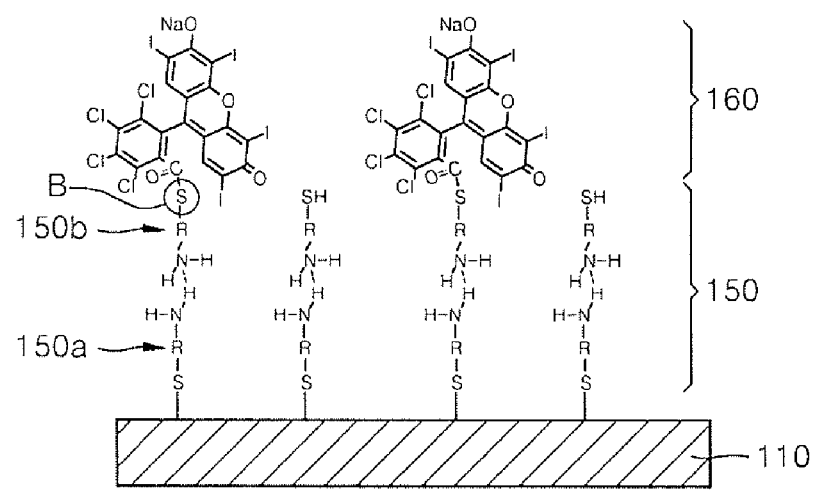
FIG. 7 illustrates a molecular active layer and an organic dielectric thin film having a double molecular layer structure, which may be included in a molecular electronic device according to an embodiment of the present invention.

FIG. 7 illustrates an exemplary chemical structure obtained after the molecular active layer 160 is formed on the organic dielectric thin film 150 with the double molecular layer structure exemplified in FIG. 6 through a chemical bond with a Rose Bengal compound having a structure represented by Formula 3.

As reference denotation "B" shows in FIG. 7, the Rose bengal compound reacts with a —SH group existing on the upper surface of the organic dielectric thin film 150 to be formed on the organic dielectric thin film 150 through —S— bonding.

To form the molecular active layer 160, the resultant structure including the organic dielectric thin film 150 may be dipped into an organic solvent in which an organic compound is dissolved for a certain period of time. The organic compound includes one functional group selected from a group consisting of a —COOH group, a —COONa group, and a succin imidyl ester group and has $\pi$ electrons. The process of forming the molecular active layer 160 is performed at a temperature of about 15° C. to 30° C.

Figure 5D:
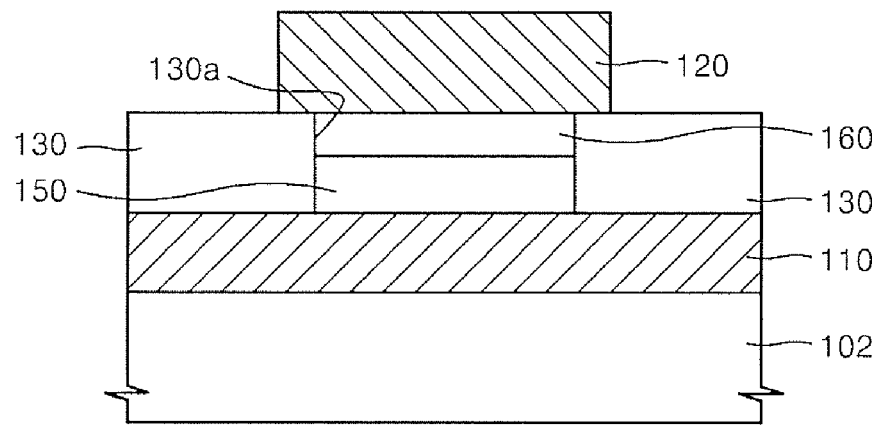

Referring to FIG. 5D, a top electrode 120 is formed on the molecular active layer 160. The top electrode 120 may be formed at low pressure and low temperature by employing a typical vapor deposition method.

Since the organic dielectric thin film 150 is formed on the bottom electrode 110, a spacing distance from the upper surface of the molecular active layer 160 to the bottom electrode 110 increases by the thickness of the organic dielectric thin film 150. Therefore, when the top electrode 120 is formed, even if the electrode material used to form the top electrode 120 penetrates into the molecular active layer 160, the electrode material is not likely to reach the bottom electrode 110 since the distance to the bottom electrode 110 increases due to the organic dielectric thin film 150. Hence, a short circuit, usually caused by the penetration of a conductive material (e.g., electrode material for the top electrode 120) into a bottom layer, does not occur.

Hereinafter, an example for a method of fabricating a molecular electronic device according to an embodiment of the present invention will be provided.

EXAMPLE 1

Fabrication of Molecular Electronic Device

A. Fabrication of Bottom Electrode and Organic Dielectric Thin Film

An insulation layer was formed on a silicon substrate. The insulation layer was formed of silicon oxide. A plurality of bottom electrodes were formed on the insulation layer. As similar to the bottom electrodes 110 illustrated in FIG. 1, the bottom electrodes were formed in line-type patterns. A line width of each of the bottom electrodes was about 50 nm. The bottom electrodes were formed by first coating a photoresist material on the insulation layer using a spin coating method and imprinting the photoresist material to form a mask pattern using a stamp. A Ti layer and an Au layer were sequentially deposited using an electron beam deposition method. The Ti layer and the Au layer were formed to thicknesses of about 5 nm and about 30 nm, respectively. The mask pattern was removed. In the current embodiment, the bottom electrodes were formed using a nano-imprinting technology. However, the bottom electrodes could also have been formed using typical photolithography.

An organic solvent was prepared to form an organic dielectric thin film on the resultant structure including the bottom electrodes. In the present embodiment, a source material for the organic dielectric thin film was amine alkylthiol with a structure of $HS(CH_2)_{11}NH_2$. Amine alkylthiol is dissolved by a typical organic solvent, particularly, ethanol, chloroform ($CHCl_3$), or dimethylformamide (DMF). In the present embodiment, about 10 mL of DMF solution in which about 1 mM amine-alkylthiol was dissolved was prepared. For this organic solvent preparation, a solvent of anhydrous and anoxic DMF was used in a glove box maintained in an anhydrous and anoxic ambient. The resultant structure including the bottom electrodes was dipped into the prepared DMF solution for about 24 hours to form an organic dielectric thin film with a double molecular layer structure including first and second molecular layers. The first molecular layer was self-assembled on the surface of the bottom electrodes, and the second molecular layer was formed on the first molecular layer, binding to the first molecular layer through hydrogen bonds. The first molecular layer and the second molecular layer were each individually provided from an amine alkylthiol compound. The process of forming the hydrogen bonds between the first molecular layer and the second molecular layer on the first molecular layer was performed in situ with the process of self-assembling of the first molecular layer on the bottom electrodes.

The resultant structure including the organic dielectric thin film was formed was cleaned with DMF solution. The cleaned resultant structure was dried using a nitrogen gun, and put into a low temperature vacuum oven for about 4 hours or more, so that the resultant structure could be dried sufficiently. The low temperature vacuum oven was maintained at a temperature of about 20° C. and a pressure of about $10^{-6}$ Torr.

B. Formation of Molecular Active Layer

The resultant structure including the bottom electrodes with the organic dielectric thin film was dipped into ethanol solution in which an active material (e.g., about 0.5 mM Rose bengal dying agent) including a —COOH group and about 10 mM 1-(-2-dimethylaminopropyl)-3-ethylcarbodiimide (EDC) were dissolved. The dipping period was about 12 hours, and as a result of the dipping, a molecular active layer was formed on the organic dielectric thin film. The resultant structure was then cleaned using ethanol and water in sequential order and dried using a nitrogen gun.

The resultant structure obtained after the molecular active layer was formed on the organic dielectric thin film in a single molecular layer was placed into a low temperature vacuum oven and dried for about 4 hours or more. The low temperature vacuum oven was maintained at a temperature of about 20° C. and a pressure of about $10^{-6}$ Torr.

C. Formation of Top Electrode

A top electrode was formed on the molecular active layer using a deposition apparatus maintained at a vacuum pressure of about $10^{-6}$ Torr and at a low temperature of about −78° C. The top electrode was formed of Au.

EXAMPLE 2

Verification of Self-Assembled Organic Dielectric Thin Film on Electrode

According to an embodiment of the present invention, when an organic dielectric thin film including amine alkylthiol-containing double molecular layers was formed on an electrode formed of Au, a sample including an Au layer was immersed into DMF solution to verify whether the organic dielectric thin film was formed on the surface of the Au layer (i.e., electrode). Amine alkylthiol ($HS(CH_2)_{11}NH_2$) was injected into the DMF solution so that the concentration of amine alkylthiol was about 0.1 mM within the DMF solution, and a self-assembly rate of the amine alkylthiol on the surface of the Au layer was observed using a quartz crystal microbalance (QCM).

Figure 8:
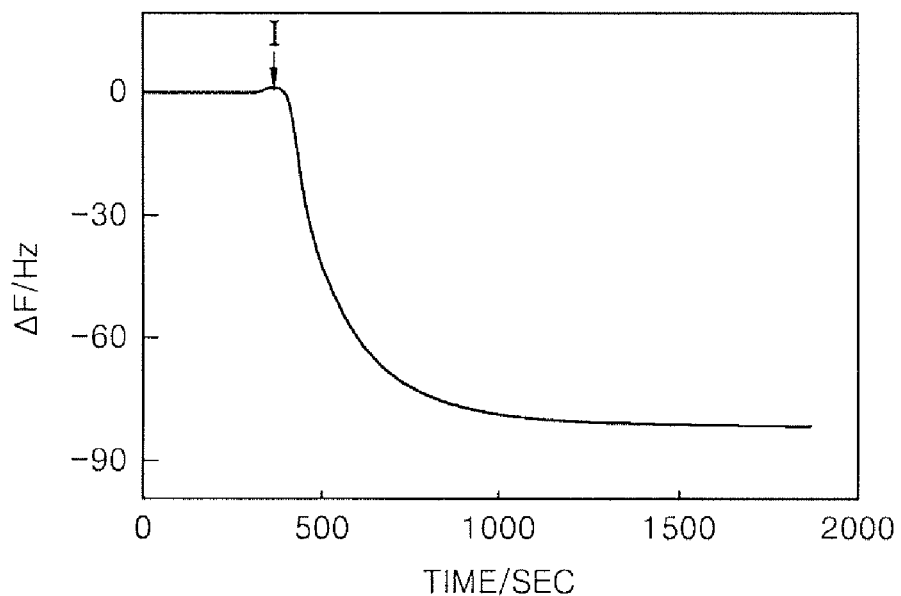
FIG. 8 illustrates a graph of amounts of amine alkylthiol adsorbed onto the surface of a gold (Au) layer with respect to time using a quartz crystal microbalance (QCM)

FIG. 8 illustrates a graph of amounts of the amine alkylthiol adsorbed onto the surface of the Au layer with respect to time using the QCM.

In FIG. 8, "I" indicates a moment at which the amine alkylthiol was injected into the DMF solution into which the Au layer was immersed. From the graph illustrated in FIG. 8, it was verified that the amine alkylthiol was voluntarily adsorbed onto the surface of the Au layer.

EXAMPLE 3

Fabrication of Molecular Electronic Device Including Organic Dielectric Thin Film with Single Molecular Layer Structure As comparison, an organic dielectric thin film with a single molecular layer was formed on an Au layer, and a molecular active layer chemically bound to the organic dielectric thin film to thereby fabricate a molecular electronic device. The organic dielectric thin film with the single molecular layer was obtained by self-assembling a compound of $HS(CH_2)_2NH_2$ on the Au layer, and chemically binding an active material including a dying agent, such as Rose bengal, to the organic dielectric thin film so as to form the molecular active layer.

EXAMPLE 4

Measurement of Thicknesses of Organic Dielectric Thin Film and Molecular Active Layer The thicknesses of the organic dielectric thin film and the molecular active layer chemically bound to the organic dielectric thin film, which were included in each of the molecular electronic device fabricated in Example 1 and the molecular electronic device fabricated in Example 3 were measured using a spectroscopic ellipsometer (SE) in a wavelength region of about 200 nm to 800 nm.

Figure 9:
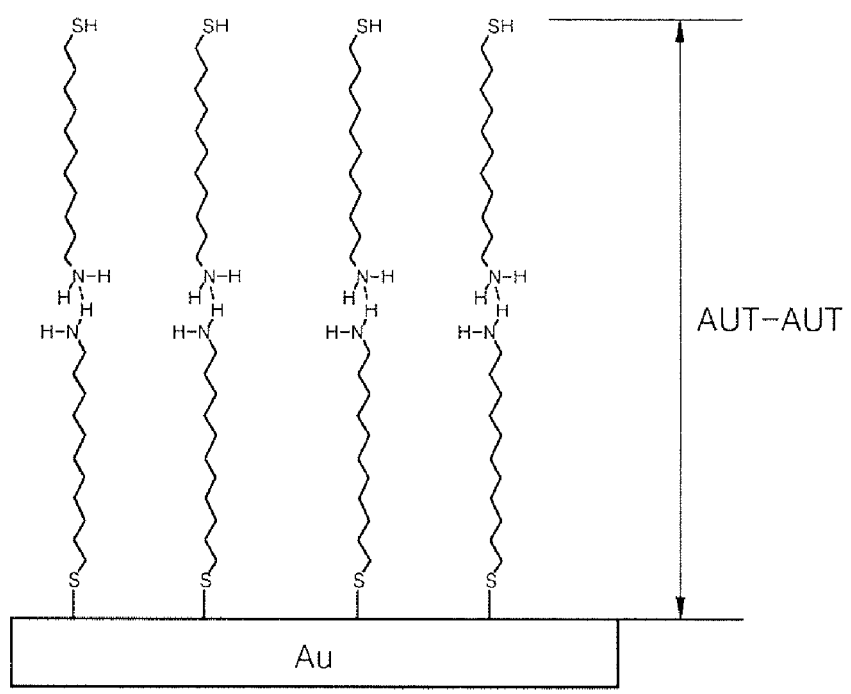
FIG. 9 illustrates an organic dielectric thin film having a double molecular layer structure, which may be included in a molecular electronic device according to an embodiment of the present invention.

FIG. 9 illustrates a chemical structure of an organic dielectric thin film AUT-AUT formed on an Au layer in a molecular electronic device fabricated as described in Example 1, wherein the organic dielectric thin film includes a structure of amine alkylthiol-containing double molecular layers self-assembled on the Au layer. This chemical structure is denoted as "AUT-AUT."

Figure 10:
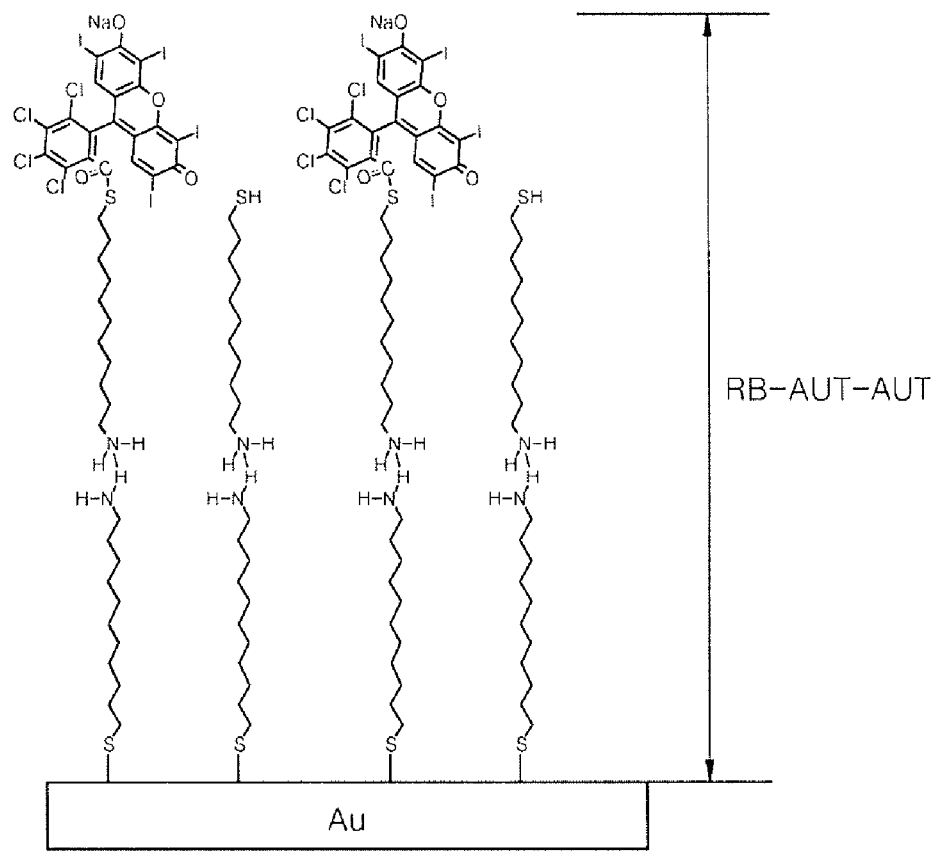
FIG. 10 illustrates a molecular active layer and an organic dielectric thin film having a double molecular layer structure, which may be included in a molecular electronic device according to an embodiment of the present invention.

FIG. 10 illustrates a chemical structure of an organic dielectric thin film including a structure of amine alkylthiol-containing double molecular layers self-assembled on an Au layer, and a molecular active layer chemically binding to the organic dielectric thin film in a molecular electronic device fabricated as described in Example 1. This chemical structure is denoted as "RB-AUT-AUT."

Figure 11:
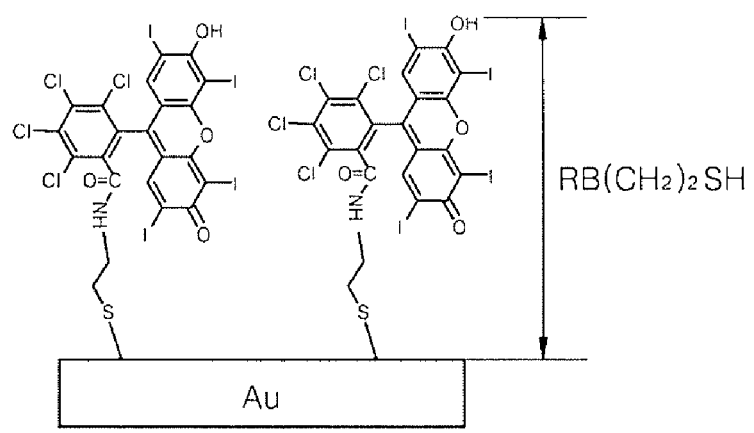
FIG. 11 illustrates an organic dielectric thin film having a single molecular layer and a molecular active layer (e.g., $RB(CH_2)_2SH$)

FIG. 11 illustrates a chemical structure $RB(CH_2)_2SH$ of an organic dielectric thin film and a molecular active layer chemically binding to the organic dielectric thin film, wherein the organic dielectric thin film is formed in a single molecular layer structure as described in Example 3.

Figure 12:
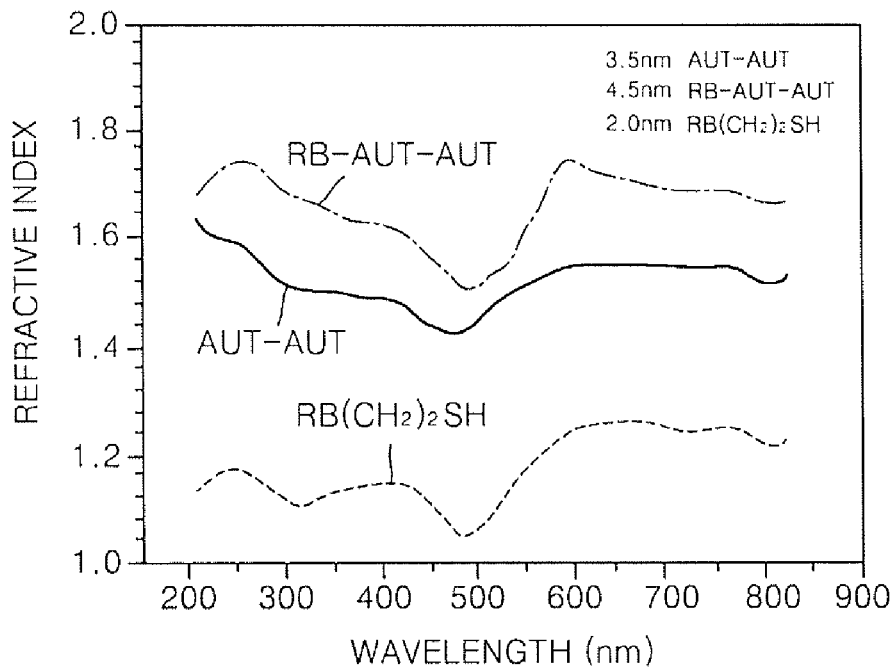
FIG. 12 illustrates a graph of refractive index with respect to wavelength using a spectroscopic ellipsometer (SE) to measure the thicknesses of an organic dielectric thin film and a molecular active layer, which may be included in a molecular electric device according to an embodiment of the present invention.

FIG. 12 illustrates a graph of refractive index with respect to wavelength using a SE to measure the thickness of the organic dielectric thin film AUT-AUT including the structure of double molecular layers self-assembled on the Au layer, the thickness of the organic dielectric thin film including the double molecular layer structure and the molecular active layer RB-AUT-AUT, and the thickness of the organic dielectric thin film and the molecular active layer $RB(CH_2)_2SH$ fabricated in Example 3.

In FIG. 12, the organic dielectric thin film AUT-AUT was about 3.5 nm thick. The thickness of the organic dielectric thin film and the molecular active layer RB-AUT-AUT was about 4.5 nm. The organic dielectric thin film and the molecular active layer $RB(CH_2)_2SH$ had a thickness of about 2.0 nm.

Figure 13:
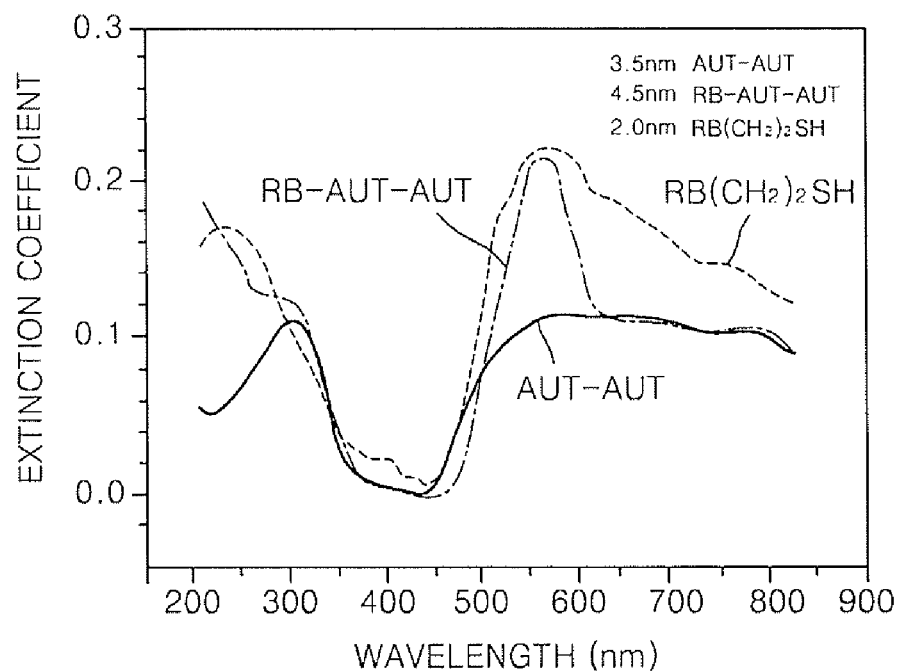
FIG. 13 illustrates a graph of extinction coefficient with respect to wavelength using a SE to determine the theoretical thicknesses of an organic dielectric thin film and a molecular active layer, which may be included in a molecular electronic device according to an embodiment of the present invention.

FIG. 13 illustrates a graph of extinction coefficient with respect to wavelength using a SE to determine the theoretical thicknesses of the organic dielectric thin film AUT-AUT, the organic dielectric thin film and the molecular active layer RB-AUT-AUT, and the organic dielectric thin film and the molecular active layer $RB(CH_2)_2SH$.

In FIG. 13, the theoretical thickness of the organic dielectric thin film AUT-AUT was determined to be about 3.4 nm. The theoretical thickness of the organic dielectric thin film and the molecular active layer RB-AUT-AUT was determined to be about 4.6 nm, and the theoretical thickness of the organic dielectric thin film and the molecular active layer $RB(CH_2)_2SH$ was determined to be about 1.7 nm.

On the basis of the graphs illustrated in FIGS. 12 and 13, the measured and theoretical thicknesses of the organic dielectric thin film AUT-AUT, the organic dielectric thin film and the molecular active layer RB-AUT-AUT, and the organic dielectric thin film and the molecular active layer $RB(CH_2)_2SH$ were similar to each other.

EXAMPLE 5

Evaluation of Chemical Bonding of Molecular Active Layer

A grazing angle infrared spectrophotometer (i.e., Fourier Transform Infrared (FTIR) spectroscopy) was applied for each case when only the organic dielectric thin film was formed on the Au electrode and when the molecular active layer was chemically bound to the organic dielectric thin film formed on the Au electrode in order to verify whether the molecular active layer was chemically bound to the organic dielectric thin film in the molecular electronic device fabricated in Example 1.

Figure 14:
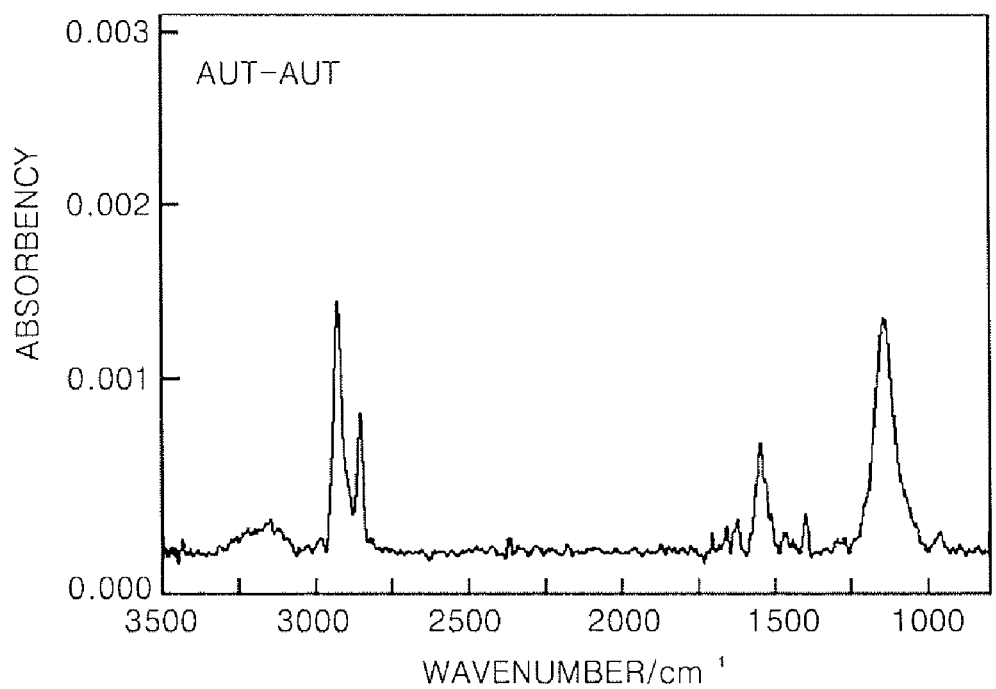
FIG. 14 illustrates a grazing angle infrared spectrophotometric spectrum obtained when forming an organic dielectric thin film on the surface of an electrode to fabricate a molecular electronic device according to an embodiment of the present invention.
Figure 15:
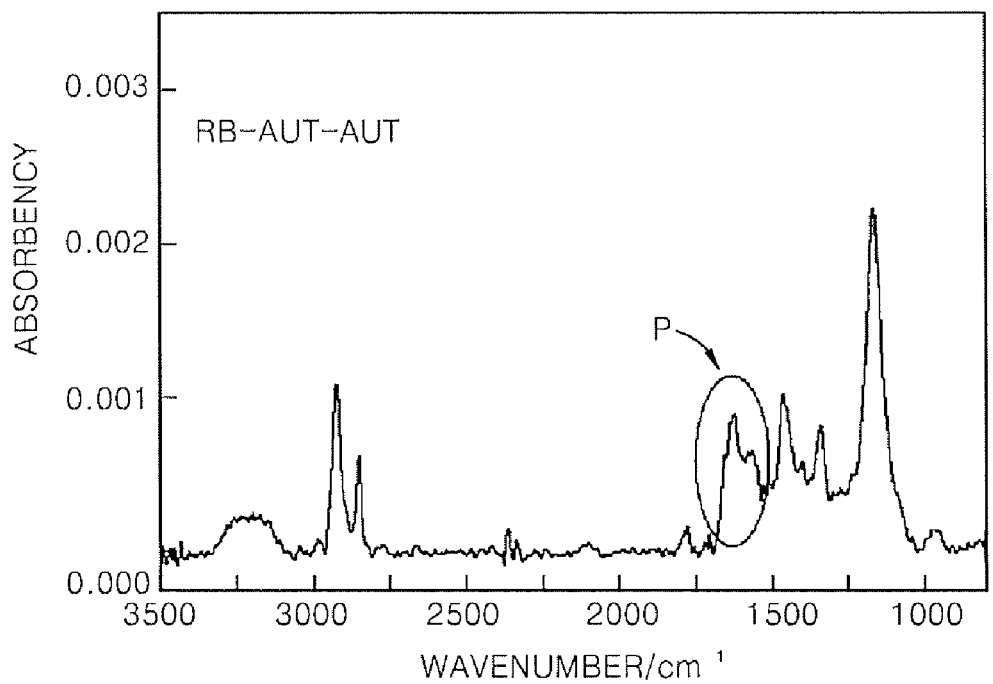
FIG. 15 illustrates a grazing angle infrared spectrophotometric spectrum obtained when forming an organic dielectric thin film and a molecular active layer on the surface of an electrode to fabricate a molecular electronic device according to an embodiment of the present invention.

FIG. 14 illustrates a grazing angle infrared spectrophotometric spectrum for the case when only the organic dielectric thin film was formed on the Au electrode (i.e., AUT-AUT). FIG. 15 illustrates a grazing angle infrared spectrophotometric spectrum for the case when the molecular active layer was chemically bound to the organic dielectric thin film (i.e., RB-AUT-AUT).

In a region "P" shown in FIG. 15, a peak at about $1650 \, cm^{-1}$ corresponding to a C=O extensional vibration mode of Rose bengal, which is the molecular active layer chemically bound to the organic dielectric thin film (e.g., amine alkylthiol-containing double molecular layers) was observed.

EXAMPLE 6

Evaluation of Organic Dielectric Thin Film Structure

Figure 16:
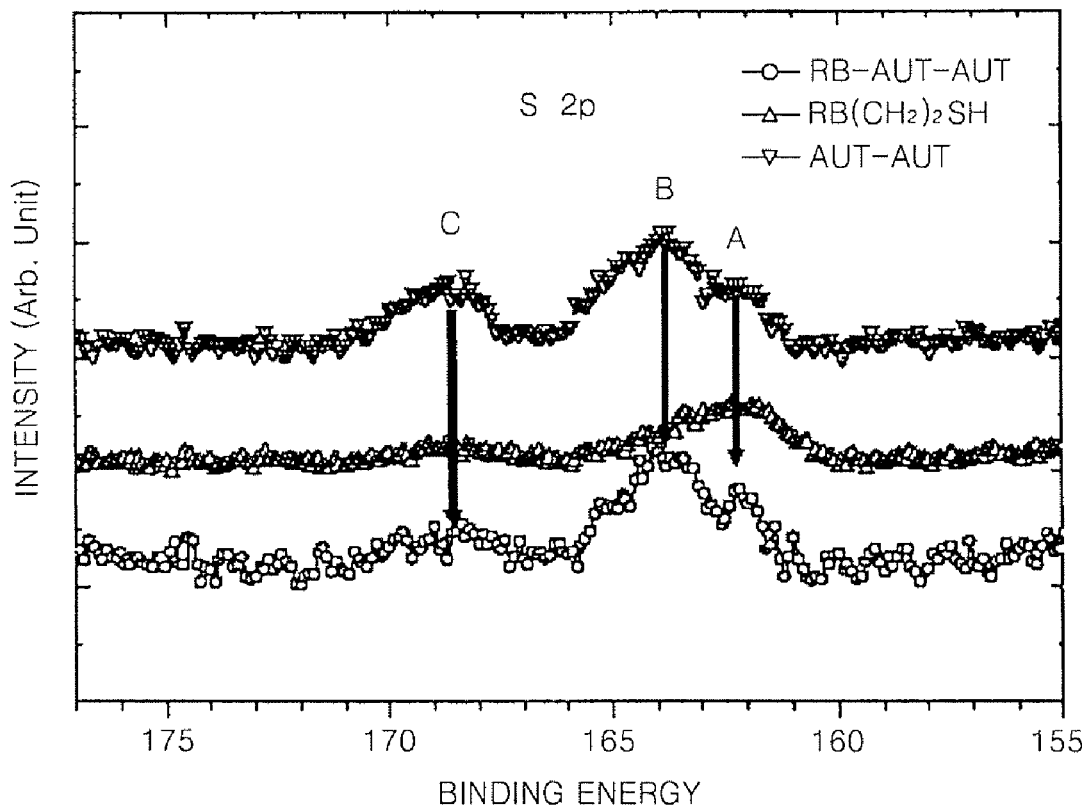
FIG. 16 illustrates infrared spectrophotometric spectra each obtained when forming an organic dielectric thin film on the surface of an electrode and when forming an organic dielectric thin film and a molecular active layer on the surface of an electrode to fabricate a molecular electronic device according to an embodiment of the present invention.

FIG. 16 illustrates surface analysis spectra for the organic dielectric thin film AUT-AUT fabricated in Example 1, the organic dielectric thin film and the molecular active layer RB-AUT-AUT fabricated in Example 1, and the organic dielectric thin film and the molecular layer $RB(CH_2)_2SH$ fabricated in Example 3, using X-ray photoelectron spectroscopy (XPS).

In FIG. 16, peaks of XPS $S_{2p}$ spectra for bound sulfur S of a thiol formed around the surface of the Au electrode as a result of self-assembled amine alkylthiol on the surface of the Au electrode, and for unbound sulfur S exposed on the organic dielectric thin film including the double molecular layer structure (i.e., AUT-AUT) can be observed.

Reference labels "A," "B," and "C" denote the peaks of "bound sulfur," "unbound sulfur," and "oxidized sulfur," respectively.

According to the spectra illustrated in FIG. 16, the peak B of "unbound sulfur" was observed for the organic dielectric film AUT-AUT, and the organic dielectric film and the molecular active layer RB-AUT-AUT, but not observed for the organic dielectric film and the molecular active layer $RB(CH_2)_2SH$.

From the spectra illustrated in FIG. 16, it could be determined that an amine terminal group of the amine alkylthiol bound to the surface of the Au electrode and an amine terminal group of amine alkylthiol-containing unbound sulfur bind together through a hydrogen bond.

EXAMPLE 7

Switching and Memory Characteristics of Molecular Electronic Device

An experiment was performed to test a switching characteristic and a memory characteristic of the molecular electronic device fabricated in Example 1. A current (I)-voltage (V) characteristic was measured using a semiconductor parameter analyzer (e.g., HP 4156C capable of measuring a range of current and voltage in a range of about 1 fA/2 V to 1 A/200V). The measurement of the switching characteristic and the memory characteristic of the molecular electronic device according to the present embodiment was analyzed based on measurement in two directions. More specifically, the measurement results for the direction from a positive (+) voltage to a negative (−) voltage and the direction from a negative (−) voltage to a positive (+) voltage were analyzed to verify the switching characteristic and the memory characteristic of the molecular electronic device fabricated in Example 1. Also, in a voltage loop, voltages in the direction of 0V→a positive (+) voltage→a negative (−) voltage→a positive (+) voltage were measured to check the switching characteristic.

Figure 17:
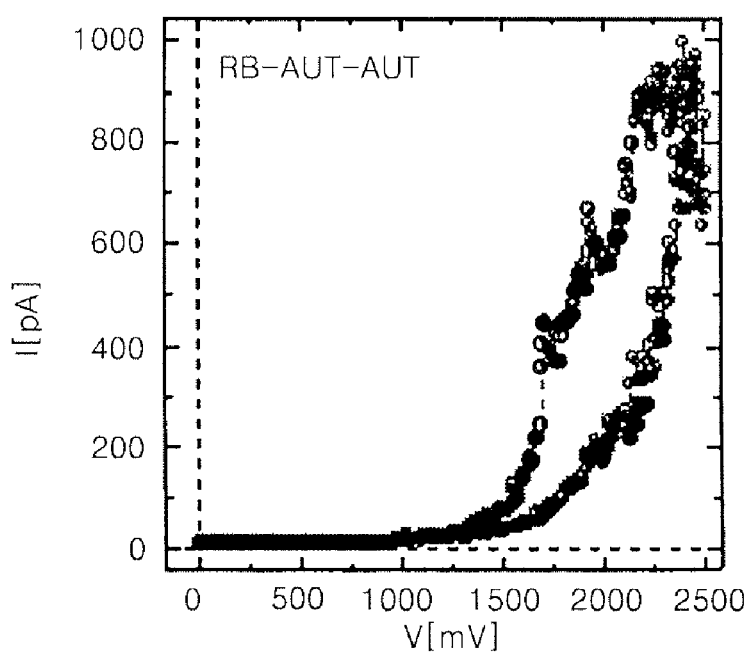
FIG. 17 illustrates a graph of current (I) versus voltage (V) in a molecular electronic device according to an embodiment of the present invention.
Figure 18:
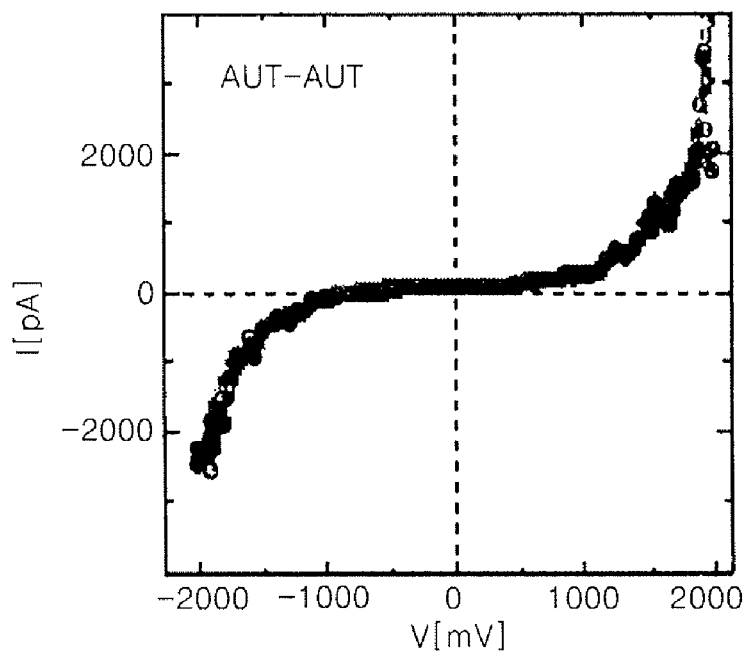
FIG. 18 illustrates a graph of current (I) versus voltage (V) obtained when a molecular active layer is not formed over an organic dielectric thin film in a molecular electronic device according to an embodiment of the present invention.
Figure 19:
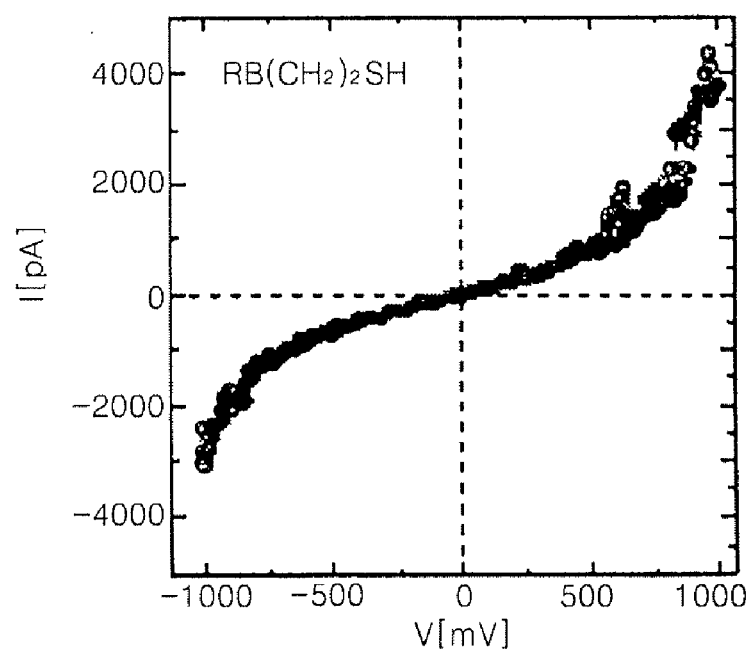
FIG. 19 illustrates a graph of current (I) versus voltage (V) in a molecular electronic device including an organic dielectric thin film with a single molecular layer and a molecular active layer formed over the organic dielectric thin film according to an embodiment of the present invention.

FIGS. 17 through 19 illustrate graphs of current (I) versus voltage (V) for the molecular electronic devices including the RB-AUT-AUT structure, the AUT-AUT structure, and the RB($CH_2$)$_2$SH structure, respectively.

As shown in the graph of FIG. 17, the molecular electronic device including the RB-AUT-AUT structure in which the molecular active layer was formed exhibited a hysteresis characteristic. In contrast, as shown in the graphs of FIGS. 18 and 19, the molecular electronic device including the AUT-AUT structure exhibited a dielectric characteristic when a signal having a high voltage was supplied to a target, and the molecular electronic device including the RB($CH_2$)$_2$SH structure exhibited ohmic behavior when a signal having a high voltage was supplied to a target.

According to the present invention, a molecular electronic device can be fabricated to have a structure including an organic dielectric thin film formed to a certain thickness on a bottom electrode, and a molecular active layer that chemically binds to the organic dielectric thin film. Therefore, when an electrode material is deposited on the molecular active layer, even if the electrode material penetrates into the molecular active layer, due to the organic dielectric thin film interposed between the bottom electrode and the molecular active layer, the distance from the molecular active layer to the bottom electrode formed below the molecular active layer increases by the thickness of the organic dielectric thin film. As a result, even if the electrode material penetrates into the molecular active layer, the organic dielectric thin film blocks the penetrated electrode material from reaching the bottom electrode, thereby preventing short circuits between the bottom electrode and the top electrode in the molecular electronic device. Accordingly, it is possible to improve yield and reliability of ultra-highly integrated nanoelectronic devices including a miniaturized structure with the size of several nanometers to several tens of nanometers.

Various structures each including the active dielectric thin film and the molecular active layer sequentially formed on the surface of the bottom electrode in molecular electronic devices fabricated according to various embodiments of the present invention have been described in detail. In particular, these structures are designed to prevent short circuits, usually caused by the penetration of an electrode material into the molecular active layer. Also, detailed descriptions of methods of fabricating such structures are provided. However, these exemplary embodiments are for illustrative purposes only, and it will be apparent to those of ordinary skill in the art that various changes in form and details may be made therein without departing from the spirit and scope of the present invention as defined by the following claims.

What is claimed is:

1. A molecular electronic device, comprising:
a substrate;
an organic dielectric thin film formed over the substrate;
a molecular active layer formed on the organic dielectric thin film and having a charge trap site;
an electrode formed on the molecular active layer; and
wherein the organic dielectric thin film comprises a molecular structure represented by the following formula:

M–R–T where M is a sulfur (S)-containing group or a silicon (Si)-containing group; R is a saturated or unsaturated $C_1$ to $C_{20}$ hydrocarbon group which is substituted or unsubstituted with fluorine (F); and T is a thiol (—SH) group, an amino(—$NH_2$) group, or a carboxyl (—COOH) group.

2. The molecular electronic device of claim 1, wherein the M is —S—.

3. The molecular electronic device of claim 2, wherein the substrate comprises a metal electrode and the organic dielectric thin film is self-assembled on the metal electrode.

4. The molecular electronic device of claim 3, wherein the metal electrode comprises one selected from a group consisting of gold (Au), platinum (Pt), silver (Ag), chrome (Cr), and a combination thereof.

5. The molecular electronic device of claim 3, wherein the metal electrode, the organic dielectric thin film, the molecular active layer, and the electrode are configured as a switching device capable of switching between an on or off state according to a voltage applied between the metal electrode and the electrode.

6. The molecular electronic device of claim 3, wherein the metal electrode, the organic dielectric thin film, the molecular active layer, and the electrode are configured as a memory storing a certain electrical signal according to a voltage applied between the metal electrode and the electrode.

7. The molecular electronic device of claim 2, wherein the M is .

8. The molecular electronic device of claim 7, wherein the substrate comprises a silicon (Si) layer and the organic dielectric thin film is formed on the Si layer.

9. The molecular electronic device of claim 8, wherein the Si layer, the organic dielectric thin film, the molecular active layer, and the electrode are configured as a charge trapping memory storing a predetermined electrical signal by charges transported from a channel formed in the Si layer according to a voltage applied to the electrode.

10. The molecular electronic device of claim 1, wherein the organic dielectric thin film is formed in a double molecular layer structure comprising first and second molecular layers.

11. The molecular electronic device of claim 10, wherein the first and second molecular layers bind together through hydrogen bonds between —$NH_2$ groups or between —COOH groups.

12. The molecular electronic device of claim 1, wherein the molecular active layer comprises a molecular layer obtained from an organic compound bound to the organic dielectric thin film, the organic compound comprising π electrons and one functional group selected from a group consisting of a —COOH group, a —COONa group, and succin imidyl ester group.

13. A molecular electronic device, comprising:
a substrate;
an organic dielectric thin film formed over the substrate;
a molecular active layer formed on the organic dielectric thin film and having a charge trap site;
an electrode formed on the molecular active layer; and
wherein the molecular active layer comprises a molecular layer obtained by chemically binding a molecule to the organic dielectric thin film, the molecule having a structure represented by one of Formulae 3 through 7 below:

Formula 3

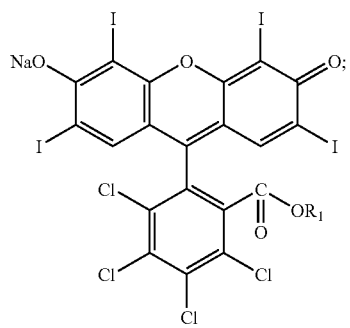

Formula 4

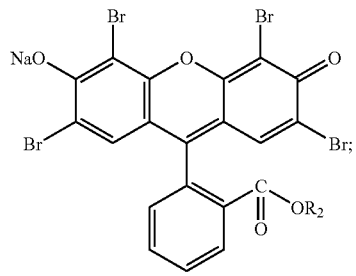

Formula 5

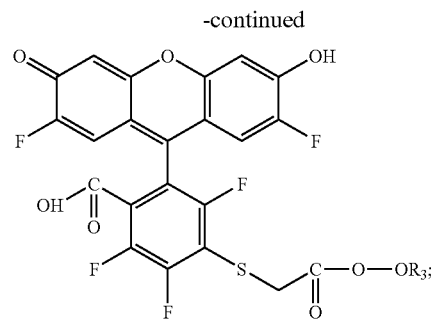

Formula 6

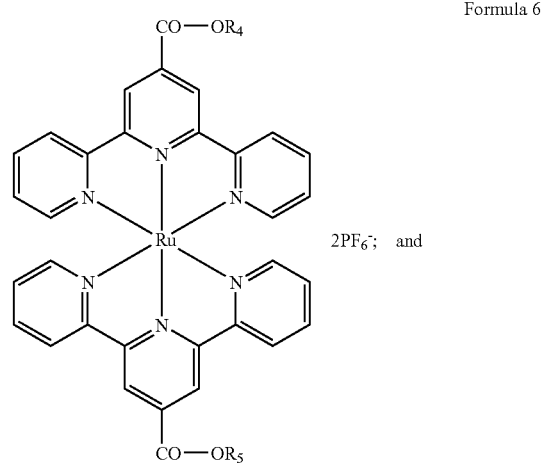

Formula 7 where $R_1$, $R_2$, $R_3$, $R_4$, $R_5$, and $R_6$ each comprise a —H, succin imidyl, or Na group.

* * * * *